United States Patent
Tseng

(10) Patent No.: US 6,620,687 B2
(45) Date of Patent: Sep. 16, 2003

(54) METHOD OF MAKING NON-VOLATILE MEMORY WITH SHARP CORNER

(76) Inventor: Horng-Huei Tseng, 5 Fl., No. 25, Lane 281, Jungyang Rd., Hsinchu (TW), 300

( * ) Notice: Subject to any disclaimer, the term of this patent is extended or adjusted under 35 U.S.C. 154(b) by 0 days.

(21) Appl. No.: 09/802,786

(22) Filed: Mar. 8, 2001

(65) Prior Publication Data

US 2002/0127804 A1 Sep. 12, 2002

(51) Int. Cl.⁷ .......................................... H01L 21/8247
(52) U.S. Cl. ..................... 438/260; 438/304; 438/596
(58) Field of Search ............................. 438/260, 264, 438/267, 304, 596, 657

(56) References Cited

U.S. PATENT DOCUMENTS

| | | | |
|---|---|---|---|
| 5,652,161 A | * | 7/1997 | Ahn ............................. 438/267 |
| 6,171,909 B1 | * | 1/2001 | Ding et al. ................... 438/267 |
| 6,261,903 B1 | * | 7/2001 | Chang et al. ................ 438/596 |
| 6,331,464 B1 | * | 12/2001 | Liou et al. ................... 438/267 |
| 6,355,525 B1 | * | 3/2002 | Nakagawa ................... 438/304 |

* cited by examiner

Primary Examiner—Chandra Chaudhari
(74) Attorney, Agent, or Firm—Clement Cheng

(57) ABSTRACT

A floating gate with sharp corner is disclosed. Wherein the sharp level of the sharp corners is control by the deposition thickness of the conductive spacers. The method comprises forming a first dielectric layer on the semiconductor substrate as a gate dielectric. A first conductive layer is formed on the first dielectric layer, and a second dielectric layer is then formed thereon. The second dielectric layer and the first conductive layer are next patterned. Subsequently, conductive spacers with sharp corners are created by well know anisotropical etching. A tunneling dielectric layer is then formed on the surface of a floating gate consisting of the spacers and patterned structure. A second conductive layer is formed on the tunneling dielectric layer as a control gate.

12 Claims, 2 Drawing Sheets

METHOD OF MAKING NON-VOLATILE MEMORY WITH SHARP CORNER

The present invention relates to a semiconductor device, and more specifically, to a method of fabricating a nonvolatile memory that includes a floating gate having sharp corners.

BACKGROUND OF THE INVENTION

The semiconductor industry has been advanced to the field of Ultra Large Scale Integrated (ULSI) technologies. The fabrication of the nonvolatile memories also follows the trend of the reduction of the size of a device. The high-density nonvolatile memories can be applied as the mass storage of portable handy terminals, solid state camera and PC cards. That is because that the nonvolatile memories exhibit many advantages, such as a fast access time, low power dissipation, and robustness. Further, it can be used to replace magnetic disk memory.

The nonvolatile memories include various types of devices, such as EAROM (electrically alterable read only memory), EEPROM (electrically erasable programmable read only memory), EEPROM-EAROMs and non-volatile SRAMs. Different types of devices have been developed for specific applications requirements in each of these segments. These parts have been developed with a focus on the high endurance and high speed requirements. In such device, electrical alterability is achieved by Fowler-Nordheim tunneling which is cold electron tunneling through the energy barrier at a silicon-thin dielectric interface and into the oxide conduction band. Typically, the thin dielectric layer is composed of silicon dioxide and the thin silicon dioxide layer allows charges to tunnel through when a voltage is applied to the gate. These charges are trapped in the silicon dioxide and remain trapped there since the materials are high quality insulators.

Various nonvolatile memories have been disclosed in the prior art. For example, Mitchellx has proposed EPROMs with self-aligned planar array cell. In this technique, buried diffusion self-aligned to the floating gate avalanche injection MOS transistor is used for the bit lines. See "A New Self-Aligned Planar Cell for Ultra High Density EPROMs, A. T. Mitchellx, IEDM, Tech. pp. 548–553, 1987". Bergemont proposed another cell array for high density flash EEPROM, which can be seen in "NOR Virtual Ground (NVG)—A New Scaling Concept for Very High Density FLASH EEPROM and its Implemntation in a 0.5 μm Process, A Bergemont, IEEE, pp. 15–18, 1993". This cell structure is introduced for scaling down the size of the devices to fabricate high density EEPROMs. Another prior art that relates to the field is disclosed in the U.S. Pat. No. 4,203,158.

However, most of such device includes a floating gate transistor and a separate select transistor for each storage site. These structures occupies larger area, it does not meet the trend of the technology. One prior art discloses single transistor nonvolatile device. Please refer to U.S. Pat. No. 5,029,130 to Bing Yeh, which assigned to Silicon Storage Technology. In the prior art, Bing Yeh disclosed a device with sharp corner to improve the performance of the device.

SUMMARY OF THE INVENTION

The object of the present invention is to form one single transistor nonvolatile memory that includes shape corners to improve the efficiency of electron injection.

A method for manufacturing one single transistor nonvolatile memory is disclosed. The method comprises forming a first dielectric layer on the semiconductor substrate as a gate dielectric. A first conductive layer is formed on the first dielectric layer, and a second dielectric layer is then formed thereon. The second dielectric layer and the first conductive layer are next patterned. Subsequently, conductive spacers with sharp corners are created by well know anisotropical etching. A tunneling dielectric layer is then formed on the surface of a floating gate consisting of the spacers and patterned structure. A second conductive layer is formed on the tunneling dielectric layer as a control gate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention proposes a novel method to fabricate the device. In the method, conductive spacers will be used as floating gate. Further, the proposed recipe is simpler than the prior art. The detail description of the method will be seen as follows. In a preferred embodiment, as shown in the FIG. 1, a single crystal silicon substrate 2 with a <100> or <111> crystallographic orientation is provided. A dielectric such as oxide layer 4 is formed on the substrate 2 as gate dielectric layer. Typically, the oxide 4 can be grown in oxygen ambient in a furnace at a temperature of about 800 to 1100 degrees centigrade. The thickness of the silicon oxide layer 4 is about 50 to 500 angstroms. Other method, such as chemical vapor deposition, can be used to form the oxide 4. It is appreciated that any suitable material such as silicon oxynitride may be used as the gate dielectric. Preferably, the silicon oxynitride layer 14 is formed by thermal oxidation in $N_2O$ or NO environment. The temperature for forming the silicon oxynitride layer 14 ranges from 700 to 1150 degrees centigrade.

Figure 1:
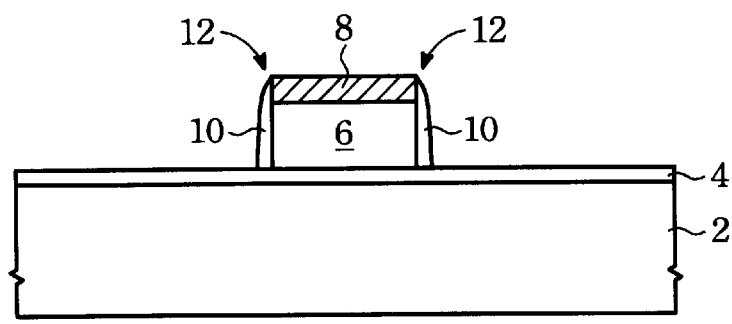
FIG. 1 is a cross section view of a semiconductor wafer illustrating the steps of forming a floating gate and conductive spacer on a semiconductor substrate according to the present invention.

Next, as can be seen by reference to FIG. 1, a conductive layer, such as doped polysilicon layer 6, is formed on the oxide layer 4. The doped polysilicon layer 6 can be chosen from doped polysilicon or in-situ doped polysilicon. In addition, the metal or alloy layer can be used in lieu of the polysilicon 6 as the conductive layer. Subsequently, a further dielectric layer 8 is deposited on the conductive layer 6. The layer 8 may be composed of any suitable material such as oxide or nitride. The silicon nitride layer 6 is deposited by any suitable process. For example, Low Pressure Chemical Vapor Deposition (LPCVD), Plasma Enhance Chemical Vapor Deposition (PECVD), High Density Plasma Chemical Vapor Deposition (HDPCVD). In the preferred embodiment, the reaction gases of the step to form silicon nitride layer include $SiH_4$, NH3, $N_2$, $N_2O$ or $SiH_2Cl_2$, $NH_3$, $N_2$, $N_2O$.

Then, photolithography technology is used to pattern the conductive layer 6 and the dielectric layer 8. A second conductive layer is successively formed along the surface of the patterned structure and the dielectric layer 4. An isotropical etching is performed to etch the second conductive layer 10 to construct spacers 10 attached on the side wall of the patterned structure. The conductive layer 6 and the spacers 10 acts as the floating gate of the device. The floating gate includes sharp corners 12 located at the upper portion of the spacers 10. The sharp corners 12 on the upper portion improve the efficient of electron injection. Preferably, the conductive spacers 10 are formed of doped polysilicon layer or in-situ doped polysilicon. It has to be noted that the spacers are the thicker the sharper. Therefore, we may control the thickness of the conductive layer to achieve the sharp level of the sharp corners.

Figure 2:
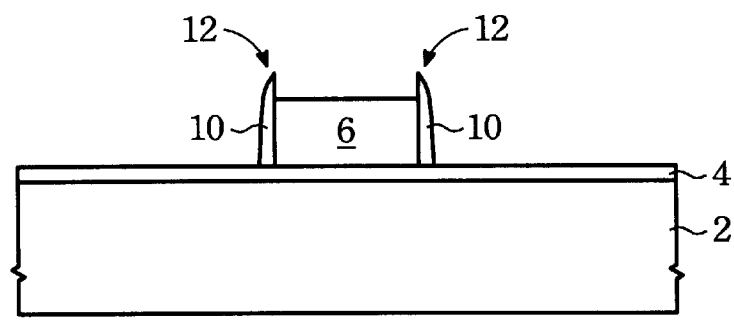
FIG. 2 is a cross section view of a semiconductor wafer illustrating the step of removing dielectric layer on the gate according to the present invention.

In the embodiment, the dielectric layer 8 can be removed or remained on the structure. The dielectric layer 8 is removed by using hot phosphorus acid solution if it is composed of nitride. Alternatively, if the dielectric layer 8 is formed of oxide, it may be removed by buffer oxide etching solution (BOE) or HF solution, as shown in FIG. 2.

Figure 3:
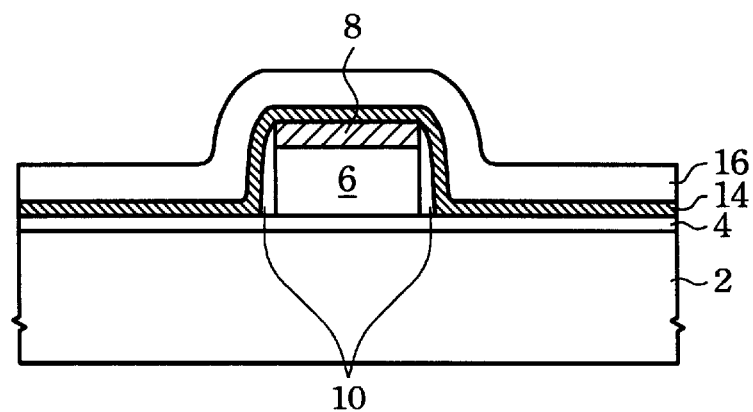
FIG. 3 and FIG. 3A are cross section views of a semiconductor wafer illustrating the step of forming dielectric layer and polysilicon layer according to the present invention.
Figure 3A:
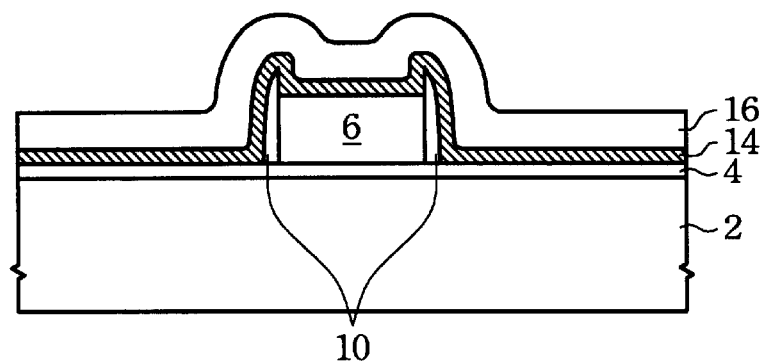
Figure 4:
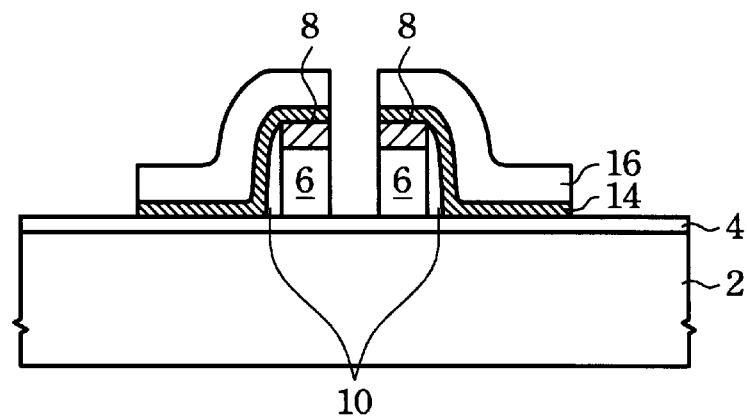
FIG. 4 and FIG. 4A are cross section views of a semiconductor wafer illustrating the step of defining control gate according to the present invention.
Figure 4A:
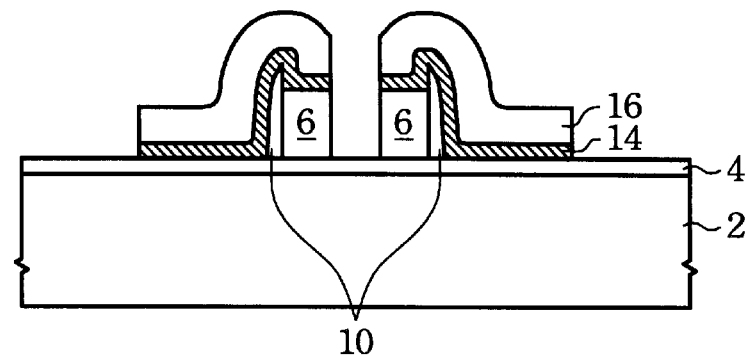

As shown in FIGS. 3 and 3A, a dielectric layer 14 is formed along the surface of the floating gates as a tunneling dielectric layer. Preferably, the tunneling dielectric may be composed by oxide, nitride, silicon oxynitride, ON (oxide/nitride) or ONO (oxide/nitride/oxide). A third conductive layer 16, such as doped polysilicon layer, is formed on the tunneling dielectric layer 14 as a control gate. Finally, turning to FIG. 4 and FIG. 4A, the lithography and etching processes are introduced to define the control gate 16 and separate the memory cell. This separation step may be omitted.

The nonvolatile memory comprises a floating gate formed on the semiconductor substrate, wherein the floating gate comprises a conductive spacer that is attached on the side wall of the floating gate. A tunneling dielectric layer is formed on a surface of the floating gate. A conductive layer is formed on the tunneling dielectric layer as a control gate.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method for manufacturing a nonvolatile memory on a semiconductor substrate, said method comprising the steps of:

forming a first dielectric layer on said semiconductor substrate as a gate dielectric;

forming a first conductive layer on said first dielectric layer;

forming a second dielectric layer on said first conductive layer;

patterning said second dielectric layer and said first conductive layer;

forming conductive spacers with sharp corners attached on said patterned second dielectric layer and said first conductive layer, wherein said conductive spacers, said second dielectric layer and said first conductive layer act as a floating gate;

forming a tunneling dielectric layer on a surface of said floating gate;

forming a third conductive layer on said tunneling dielectric layer as a control gate;

defining said control gate by a lithography process; and performing an etching process to separate said nonvolatile memory.

2. The method of claim 1, further comprising a step of removing said second dielectric layer before forming said tunneling dielectric layer.

3. The method of claim 2, wherein said second dielectric layer is composed of nitride and removed by hot phosphorus acid solution.

4. The method of claim 2, wherein said second dielectric layer is composed of oxide and removed by HF solution.

5. The method of claim 2, wherein said second dielectric layer is composed of oxide and removed by BOE (buffer oxide etching) solution.

6. The method of claim 1, wherein said first and second conductive layers comprise polysilicon.

7. The method of claim 1, wherein said conductive spacers comprise polysilicon.

8. The method of claim 1, wherein said tunneling dielectric layer comprises silicon oxynitride.

9. The method of claim 1, wherein said tunneling dielectric layer comprises silicon nitride.

10. The method of claim 1, wherein said tunneling dielectric layer comprises silicon oxide.

11. The method of claim 1, wherein said tunneling dielectric layer comprises ON (oxide/nitride).

12. The method of claim 1, wherein said tunneling dielectric layer comprises ONO (oxide/nitride/oxide).

\* \* \* \* \*